(12) United States Patent
Schlaupitz et al.

(10) Patent No.: US 9,983,342 B2
(45) Date of Patent: May 29, 2018

(54) BACKLIGHT STRUCTURES FOR AN ELECTRONIC DEVICE WITH SENSOR CIRCUITRY

(71) Applicant: Apple Inc., Cupertino, CA (US)

(72) Inventors: Alexander D. Schlaupitz, San Jose, CA (US); Jacqueline M. Howe, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 212 days.

(21) Appl. No.: 14/881,067

(22) Filed: Oct. 12, 2015

(65) Prior Publication Data

US 2016/0320543 A1 Nov. 3, 2016

Related U.S. Application Data

(60) Provisional application No. 62/155,989, filed on May 1, 2015.

(51) Int. Cl.
| | | |
|---|---|---|
| *G02F 1/13357* | (2006.01) | |
| *F21V 8/00* | (2006.01) | |
| *G06F 3/044* | (2006.01) | |
| *H05K 1/16* | (2006.01) | |
| *H05K 1/02* | (2006.01) | |
| *H05K 1/03* | (2006.01) | |

(52) U.S. Cl.
CPC ......... *G02B 6/0035* (2013.01); *G02B 6/0065* (2013.01); *G06F 3/044* (2013.01); *H05K 1/16* (2013.01); *G06F 2203/04107* (2013.01); *H05K 1/0216* (2013.01); *H05K 1/0393* (2013.01); *H05K 2201/10151* (2013.01)

(58) Field of Classification Search
CPC .......................... G02F 1/133308; G06F 3/044
See application file for complete search history.

(56) References Cited

U.S. PATENT DOCUMENTS

| | | | |
|---|---|---|---|
| 2007/0291513 A1 | 12/2007 | Zhou et al. | |
| 2009/0086420 A1 | 4/2009 | Stockham et al. | |
| 2013/0242600 A1* | 9/2013 | Franklin | G02B 6/0073 362/602 |
| 2013/0328051 A1* | 12/2013 | Franklin | H01L 29/786 257/59 |

(Continued)

FOREIGN PATENT DOCUMENTS

JP 2013011736 1/2013

*Primary Examiner* — Karabi Guharay
(74) *Attorney, Agent, or Firm* — Treyz Law Group, P.C.; G. Victor Treyz; Zachary D. Hadd

(57) ABSTRACT

A display may be mounted within an electronic device housing. The display may deflect inwardly when pressed by a user. A sensor formed from a flexible printed circuit may measure capacitance changes associated with inward deflection of the display. A backlight for the display may have a backlight plate on which the printed circuit is mounted. The backlight plate may be formed from a fiber-composite material such as carbon fiber. Multiple carbon-fiber layers may be sandwiched together to form the backlight plate. An electromagnetic shield layer may be used to electromagnetically the printed circuit. The backlight plate may have an opening in which conductive material is placed to short the electromagnetic shield layer to a ground pad on the printed circuit.

16 Claims, 9 Drawing Sheets

(56) References Cited

U.S. PATENT DOCUMENTS

| | | | |
|---|---|---|---|
| 2014/0092346 A1* | 4/2014 | Yang | G02F 1/133308 |
| | | | 349/84 |
| 2014/0125919 A1 | 5/2014 | Chen et al. | |
| 2014/0247242 A1* | 9/2014 | Lee | G06F 3/044 |
| | | | 345/174 |
| 2015/0015827 A1 | 1/2015 | Fan et al. | |
| 2016/0139702 A1* | 5/2016 | Franklin | G06F 3/044 |
| | | | 345/174 |

* cited by examiner

BACKLIGHT STRUCTURES FOR AN ELECTRONIC DEVICE WITH SENSOR CIRCUITRY

This application claims the benefit of provisional patent application No. 62/155,989 filed on May 1, 2015, which is hereby incorporated by reference herein in its entirety.

BACKGROUND

This relates generally to electronic devices and, more particularly, to display backlight structures for electronic devices with displays and sensor circuitry.

Electronic devices often include displays. Displays include arrays of pixels that present images to a user. Some displays such as organic light-emitting diode displays have pixels containing light-emitting diodes. Other displays such as liquid crystal displays are backlit. In a typical configuration, a backlight unit for a display emits light that passes through an array of liquid crystal display pixels. The backlight unit may contain light-emitting diodes that emit light into the edge of a light guide plate. The light guide plate may distribute the light from the light guide plate across the display. Scattered light from the light guide plate may serve as backlight for the liquid crystal display.

It may be desirable to incorporate a sensor into a display. For example, some displays include touch sensor arrays. Challenges may arise when incorporating components such as sensors into devices that have displays. For example, it may be difficult to ensure that the electrical and mechanical properties of a sensor are compatible with an associated display and backlight structures.

It would therefore be desirable to be able to provide improved display structure such as improved backlight structures for an electronic device with a sensor.

SUMMARY

An electronic device may be provided with a rectangular housing having a pair of opposing short edges and a pair of opposing long edges. A display may be mounted within the housing. The display may deflect inwardly when pressed by a user. A flexible printed circuit with sensor electrode structures may measure capacitance changes associated with inward deflection of the display.

The display may be backlight using backlight structures. The backlight structures may include a backlight plate on which the flexible printed circuit is mounted. The backlight plate may be formed from a fiber-composite material such as carbon fiber.

Multiple carbon-fiber layers may be sandwiched together to form the backlight plate. The carbon-fiber layers may include a pair of inner unidirectional layers having fibers that span the short edges and a pair of outer unidirectional layers having fibers that run between the long edges parallel to the short edges.

An electromagnetic shield layer may be used to electromagnetically shield the flexible printed circuit. The backlight plate may have an opening in which conductive material such as a polymer that contains embedded metal particles is placed to short the electromagnetic shield layer to a ground pad on the flexible printed circuit.

DETAILED DESCRIPTION

Figure 1:
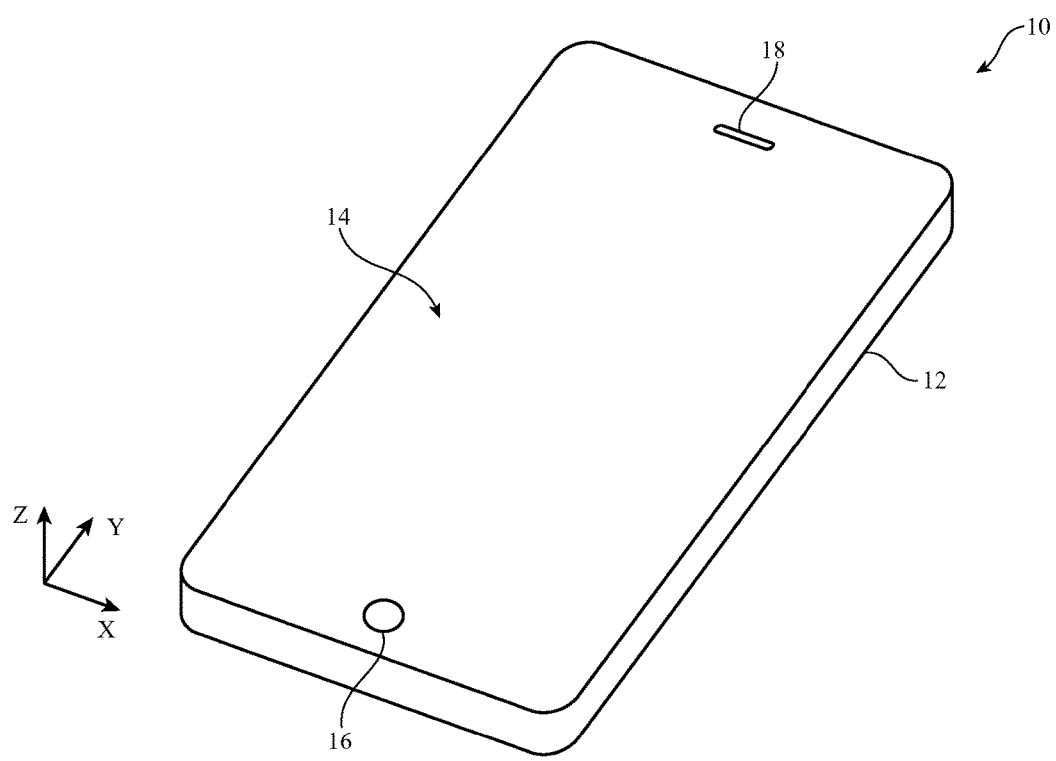
FIG. 1 is a perspective view of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A touch sensor may be formed using electrodes or other structures on a display layer that contains a pixel array or on a separate touch panel layer that is attached to the pixel array (e.g., using adhesive).

Display 14 may include an array of pixels formed from liquid crystal display (LCD) components, an array of electrophoretic pixels, an array of plasma pixels, an array of organic light-emitting diode pixels or other light-emitting diodes, an array of electrowetting pixels, or pixels based on other display technologies. Configurations in which display 14 is a backlit liquid crystal display are sometimes described herein as an example. The use of liquid crystal display pixels to form display 14 is merely illustrative. Display 14 may, in general, be formed using any suitable type of pixels.

Display 14 may be protected using a display cover layer such as a layer of transparent glass or clear plastic. Openings may be formed in the display cover layer. For example, opening may be formed in the display cover layer to accommodate a button such as button 16, a speaker port such as speaker port 18, or other components. Openings may be formed in housing 12 to form communications ports (e.g., an audio jack port, a digital data port, etc.), to form openings for buttons, etc.

Figure 2:
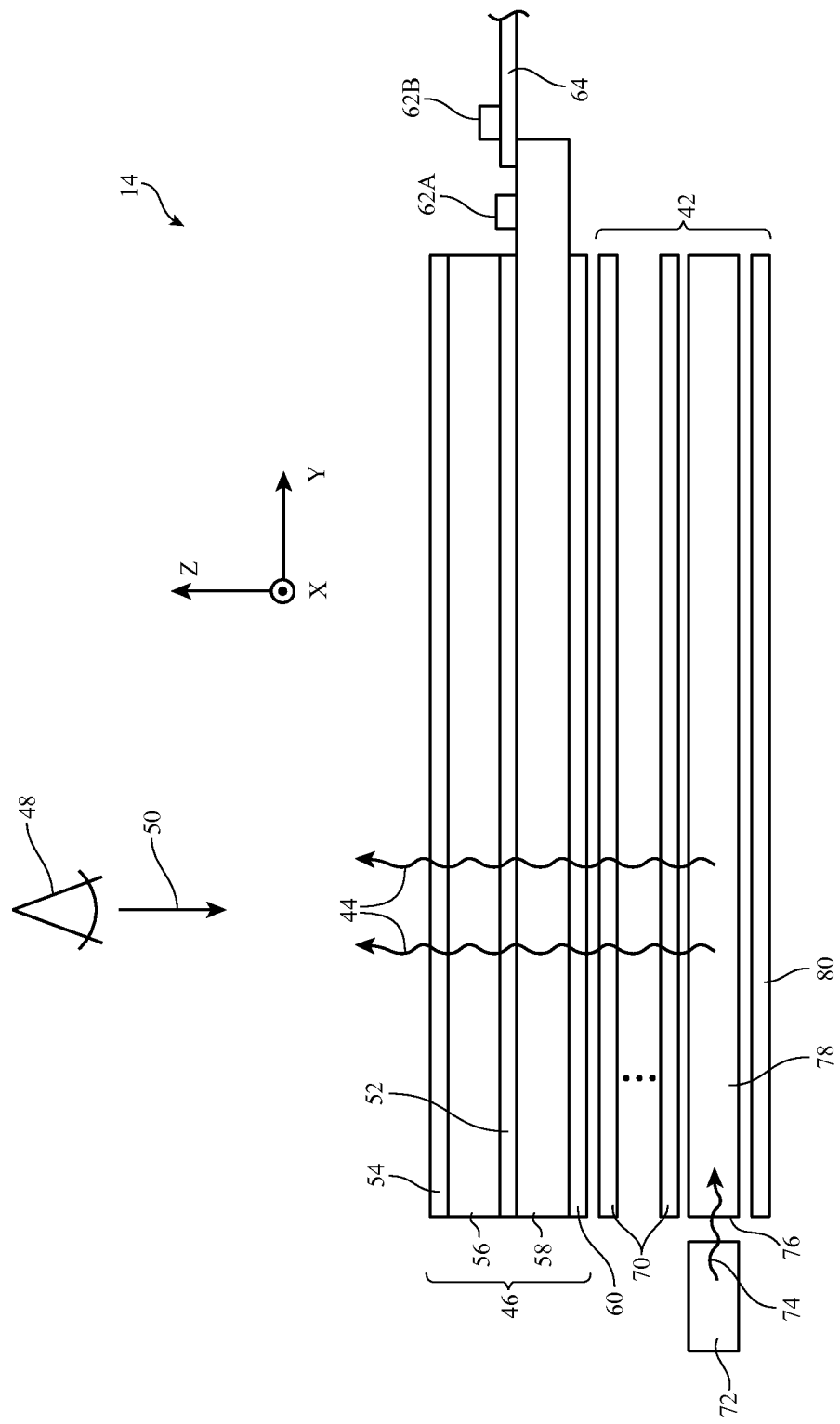
FIG. 2 is a cross-sectional side view of an illustrative liquid crystal display in accordance with an embodiment.

A cross-sectional side view of an illustrative configuration for display 14 is shown in FIG. 2. As shown in FIG. 2, display 14 may include backlight structures such as backlight unit 42 for producing backlight 44. During operation, backlight 44 travels outwards (vertically upwards in dimension Z in the orientation of FIG. 2) and passes through display pixel structures in display layers 46. This illuminates any images that are being produced by the display pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion in housing 12). Display layers 46 may form a liquid crystal display or may be used in forming displays of other types.

Display layers 46 may include a liquid crystal layer such as liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 58 and 56 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of pixel circuits based on thin-film transistors and associated electrodes (pixel electrodes) for applying electric fields to liquid crystal layer 52 and thereby displaying images on display 14. Layer 56 may be a color filter layer that includes an array of color filter elements for providing display 14 with the ability to display color images. If desired, layer 58 may be a color filter layer and layer 56 may be a thin-film transistor layer. Configurations in which color filter elements are combined with thin-film transistor structures on a common substrate layer in the upper or lower portion of display 14 may also be used.

During operation of display 14 in device 10, control circuitry (e.g., one or more integrated circuits on a printed circuit) may be used to generate information to be displayed on display 14 (e.g., display data). The information to be displayed may be conveyed to a display driver integrated circuit such as circuit 62A or circuit 62B using a signal path such as a signal path formed from conductive metal traces in a rigid or flexible printed circuit such as printed circuit 64 (as an example).

Backlight structures 42 may include a light guide plate such as light guide plate 78. Light guide plate 78 may be formed from a transparent material such as clear glass or plastic. During operation of backlight structures 42, a light source such as light source 72 may generate light 74. Light source 72 may be, for example, an array of light-emitting diodes.

Light 74 from light source 72 may be coupled into edge surface 76 of light guide plate 78 and may be distributed in dimensions X and Y throughout light guide plate 78 due to the principal of total internal reflection. Light guide plate 78 may include light-scattering features such as pits or bumps. The light-scattering features may be located on an upper surface and/or on an opposing lower surface of light guide plate 78. Light source 72 may be located at the left of light guide plate 78 as shown in FIG. 2 or may be located along the right edge of plate 78 and/or other edges of plate 78.

Light 74 that scatters upwards in direction Z from light guide plate 78 may serve as backlight 44 for display 14. Light 74 that scatters downwards may be reflected back in the upwards direction by reflector 80. Reflector 80 may be formed from a reflective material such as a layer of plastic covered with a dielectric mirror thin-film coating.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and brightness enhancement films (also sometimes referred to as turning films) for collimating backlight 44. Optical films 70 may overlap the other structures in backlight unit 42 such as light guide plate 78 and reflector 80. For example, if light guide plate 78 has a rectangular footprint in the X-Y plane of FIG. 2, optical films 70 and reflector 80 may have a matching rectangular footprint. If desired, films such as compensation films may be incorporated into other layers of display 14 (e.g., polarizer layers).

It may be desirable to incorporate a touch sensor and other sensors into device 10 to capture input from a user. For example, an array of capacitive touch sensor electrodes may be formed under the display cover layer for device 10 (i.e., between layers 46 and the outermost layer of display 14). If desired, force sensing technology may be incorporated into display 14 (e.g., to measure how firmly a user is pressing against display 14).

Figure 3:
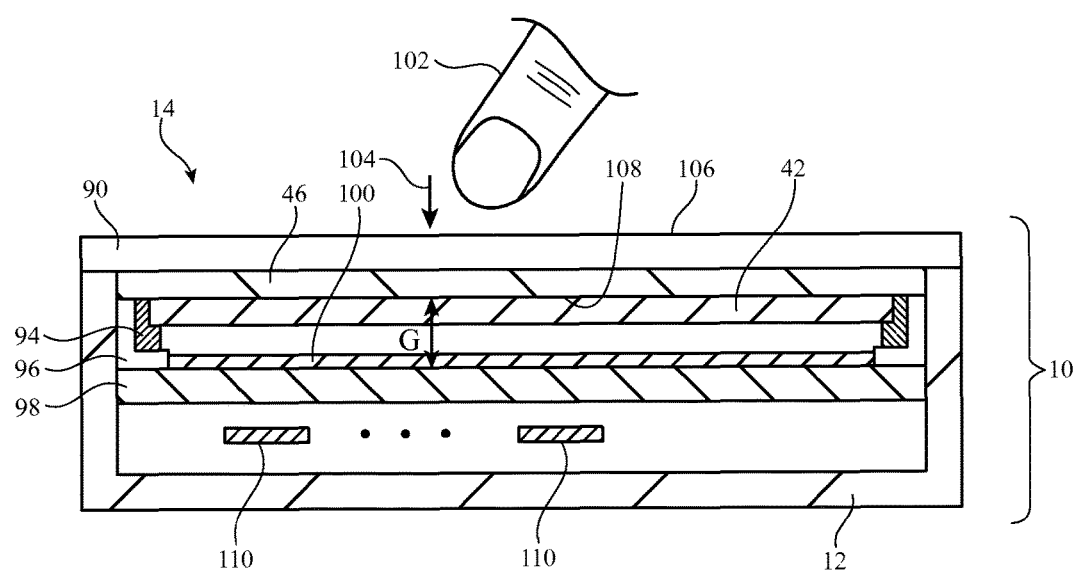
FIG. 3 is a cross-sectional side view of an illustrative electronic device having a display with a backlight and a sensor formed using a flexible printed circuit mounted on a backlight plate in accordance with an embodiment.

A cross-sectional side view of device 10 in an illustrative configuration in which device 10 includes a force sensor that detects pressure from a user's fingers or other external object is shown in FIG. 3. In the illustrative arrangement of FIG. 3, device 10 includes a display such as display 14 having display layers 46 (e.g., a liquid crystal display of the type shown in FIG. 2) mounted under a display cover layer such as display cover layer 90 (e.g., a layer of clear glass, transparent plastic, sapphire, a combination of these materials, or other materials). Display cover layer 90 may be mounted on the front face of housing 12, so that a user (e.g., fingertip 102 or other external object) may press downwards on display cover layer 90 in direction 104 to provide input to device 10.

As shown in FIG. 3, backlight unit 42 (e.g., the backlight structures of FIG. 2) may be located under lower surface 108 of display layers 46 and may be mounted in a support structure such as a chassis formed from plastic structures 94 and 96 and backlight plate 98. Structures 94 and 96 may be formed from white and black shots of molded plastic respectively or may be formed from other plastic structures. Structures 94 and 96 may form a rectangular ring-shaped frame into which display structures such as backlight unit 42 and display layers 46 may be mounted. Unit 42 and layers 46 may have a rectangular outline when viewed from the front of device 10 and structures 94 and 96 may form all or part of a plastic rectangular ring or display 14 may have other shapes (e.g., display 14 may be round, etc.).

Plastic structures 94 and 96 may be supported by a supporting member such as backlight plate 98 (sometimes referred to as a backlight unit plate or M-chassis, etc.). Structures 94 and 96 may be attached to plate 98 using a layer of adhesive (e.g., pressure sensitive adhesive or liquid adhesive such as adhesive cured using room temperature curing, elevated temperature curing, moisture curing, curing by application of ultraviolet light or other light, curing using catalyst, or other curing techniques, etc.). The thickness of the adhesive used to attach structures 94 and 96 to plate 98 may be 10-60 microns, more than 5 microns, less than 70 microns, or other suitable thickness. Plate 98 may form a structural support for backlight 42 and may be formed from metal, plastic, fiber-composite material such as carbon fiber materials, other materials, or combinations of these materials. Plate 98 may be solid (i.e., plate 98 may form a substantially rectangular member without openings) or plate 98 may have one or more openings.

A flexible printed circuit for a force sensor (sometimes referred to as a "sensor flex") such as sensor flex 100 may be mounted on plate 98. Sensor flex 100 may include one or more electrodes that make capacitance measurements. The capacitance signals measured by the electrode structures on sensor flex 100 are proportional to the distance G between the sensor flex electrodes and the conductive structures of thin-film transistor layer 58 on lower surface 108 of display layers 46. The measured capacitance may be lowest when finger 102 is not pressing downwards on display cover layer 90. In this configuration, layer 90, surface 108 of display layer 46, and backlight unit 42 are undeflected (i.e., these layers are planar). When a user presses finger 102 downwards on the upper surface of layer 90 in direction 104, layer 90, display layers 46, and backlight unit 42 may deflect downwards towards the electrode structures of sensor flex 100. The reduction in the distance G between the conductive electrode structures formed from thin-film transistor layer 58 and the conductive electrode structures in sensor flex 100 results in an increase in the measured capacitance. The change in capacitance that is sensed in this way is proportional to the amount of downward force by finger 102 and therefore can be used as a force sensor output signal.

Satisfactory operation of the force sensor that measures the capacitance between deflecting display layer 46 and sensor flex 100 can be ensured by forming backlight plate 98 from a rigid layer. When plate 98 is sufficiently rigid, plate 98 and therefore sensor flex 100 will exhibit minimal deflection or no deflection when a user presses in direction 104 on display 14. As a result, the deflection of display 14 (e.g., surface 108) relative to the conductive sensor electrodes on sensor flex 100 can be accurately measured. Plate 98 may be formed from one or more layers of rigid material such as metal, plastic, ceramic, etc. With one suitable arrangement, plate 98 is formed from a fiber-based composite such as carbon fiber material.

As shown in FIG. 3, electrical components 110 may be mounted within the interior of housing 12. Electrical components 110 may include integrated circuits, wireless circuitry, and other devices that produce electromagnetic signals that have the potential to interfere with the operation of the force sensor formed from sensor flex 100 and other components in device 10. To reduce interference, it may be desirable to interpose an electromagnetic shield between components 108 and the force sensor electrode structures of sensor flex 100. For example, a layer of conductive material may be incorporated into plate 98, may be mounted on plate 98, or may be incorporated into sensor flex 100 (e.g., on the lower surface of flex 100) to serve as an electromagnetic shield.

The electromagnetic shield may be grounded by coupling the electromagnetic shield to a suitable source of ground potential. With one illustrative arrangement, sensor flex 100 contains a ground (e.g., one or more metal traces patterned to form ground contacts) and a conductive path is used to short the electromagnetic shield layer to the ground. The conductive path may be formed from a conductive polymer. The conductive polymer may be formed by incorporating metal particles or other conductive particles into a polymer binder. The binder (resin) may be a liquid polymer that is cured at room temperature, that is cured using a catalyst, that is cured by applying heat, and/or that is cured by applying ultraviolet light, light at other wavelengths, or other energy to cure and harden the conductive polymer. With one suitable arrangement, the conductive polymer that is used to ground the shield layer to the ground traces in sensor flex 100 is curable liquid polymer that includes silver particles. Other conductive structures may be used to ground the shield to the ground traces of sensor flex 100 or other source of ground potential in device 10 if desired.

Backlight plate 98 may be formed from fiber composite materials such as carbon fiber materials or fiber composites with other types of fiber impregnated in a polymer binder (sometimes referred to as a matrix) such as epoxy or other curable resin. One or more layers of fiber-composite material may be used in forming plate 98. The fiber-composite material may be formed from unidirectional fibers, from woven fibers, from multiple layers each having fibers and/or fabric formed from fibers that are oriented in different directions, or other types of fiber-composite structures. If desired, fiber-composite layers may be combined with plastic sheets, metal sheets, and/or other layers of material. Configurations in which backlight plate 98 has been formed from multiple unidirectional sheets of carbon fiber material are sometimes described herein as an example. This is, however, merely illustrative. Plate 98 may be formed from any suitable materials.

Figure 4:
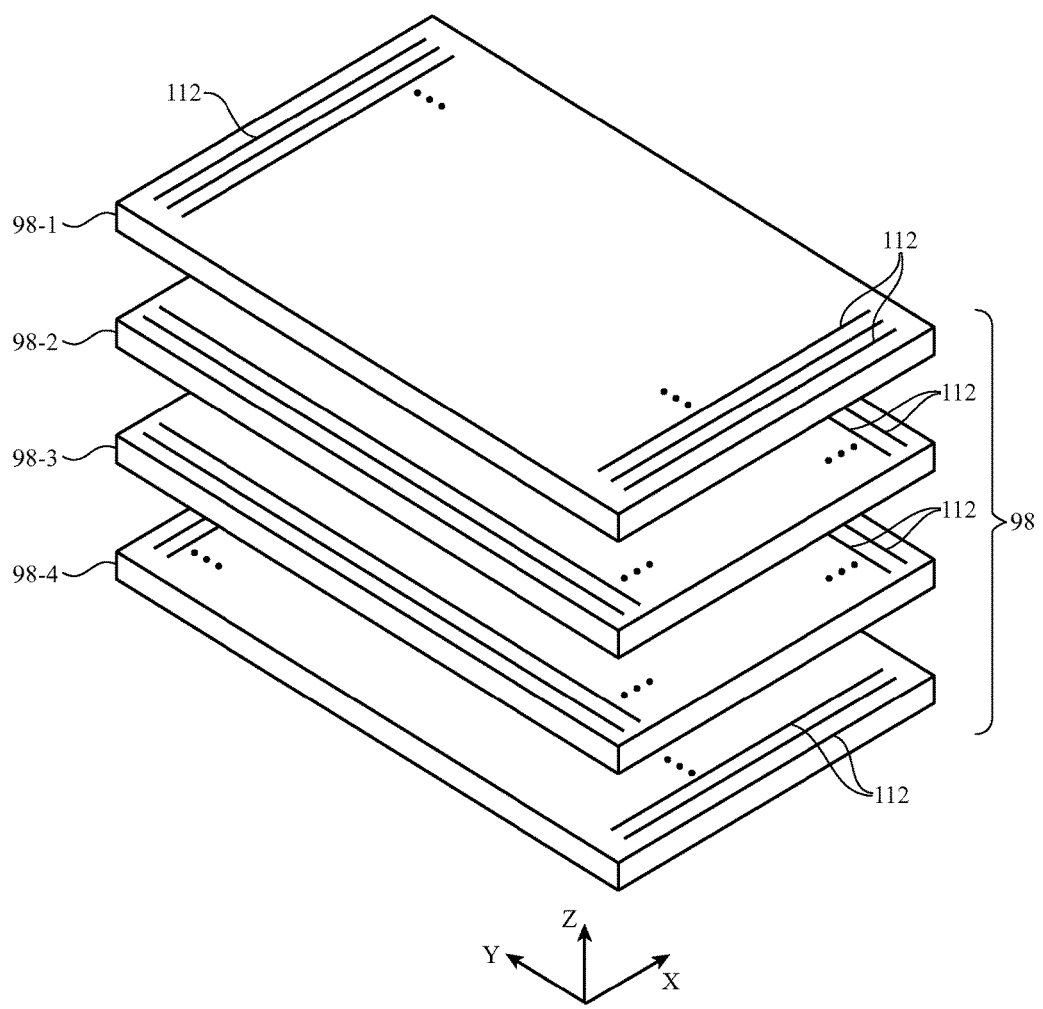
FIG. 4 is an exploded perspective view of an illustrative backlight plate in accordance with an embodiment.

An exploded perspective view of an illustrative set of carbon fiber layers that may be used in forming plate 98 is shown in FIG. 4. In the example of FIG. 4, plate 98 has been formed from four carbon fiber layers 98-1, 98-2, 98-3, and 98-4. Initially, these layers may be provided in the form of partly cured material (sometimes referred to as prepreg). Plate 98 may by formed by compressing these layers together (with or without intervening layers of adhesive) under heat and pressure until the prepreg is cured and forms a rigid support member. The thickness of plate 98 (e.g., the collective thickness of layers 98-1, 98-2, 98-3, and 98-4 or other such layers) may be 0.2-0.4 mm, more than 0.1 mm, less than 0.7 mm, less than 0.6 mm, less than 0.4 mm, etc.

Each layer in plate 98 may be a unidirectional carbon fiber layer having carbon fibers that run along one of its lateral dimensions. In the example of FIG. 4, the two outermost layers of the stack of layers in FIG. 4 (i.e., upper layer 98-1 and lower layer 98-4) preferably each have carbon fibers 112 that run parallel to their shorter lateral dimension (i.e., dimension X, which corresponds to the width of display 14 from left to right in device 10 of FIG. 1). Fibers 112 in the outer layers therefore run between the two opposing long edges of housing 12. The diameters of fibers 112 may be about 10 microns, less than 25 microns, 5-15 microns, more than 2 microns, less than 15 microns, or other suitable size. The two innermost layers of the stack of layers in FIG. 4 (i.e., middle layers 98-2 and 98-3) preferably each have carbon fibers 112 that run parallel to their longer lateral dimension (i.e., dimension Y, which corresponds to the length of display 14 from its lower edge to its upper edge in device 10 of FIG. 1). The innermost layers therefore span the two opposing shorter edges of housing 12 and run parallel to the longer edges of housing 12.

Because the fibers in different layers are oriented perpendicular to each other, the rigidity of plate 98 is enhanced. Rigidity is further enhanced in the arrangement of FIG. 4 by placing the layers whose fibers 112 span the shorter lateral dimension of plate 98 (i.e., layers 98-1 and 98-4) at the outermost layer positions in the stack of layers. In this position, the width-spanning fibers 112 of layers 98-1 and 98-4, which can be supported by portions of device 10 such as housing 12 and structures 94 and 96 of FIG. 3, are farthest from the center of plate 98 (i.e., farthest in vertical dimension Z from the center of plate 98 in vertical dimension Z) and are therefore most effective at resisting bending of plate 98 out of the X-Y plane. Because the layers of FIG. 4 are vertically symmetrical (i.e., because layers 98-1 and 98-2 form a mirror image of layers 98-3 and 98-4), the neutral stress plane of plate 98 may be aligned with the middle of plate 98, thereby helping to reduce and balance stresses within plate 98 when plate 98 is deflected.

Figure 5:
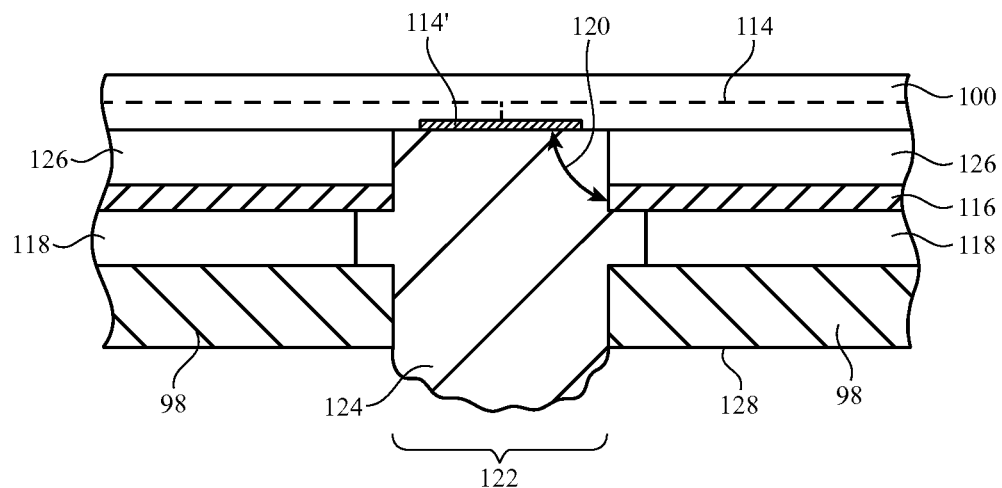
FIG. 5 is a cross-sectional side view of an illustrative backlight plate in which a shield layer is formed from a layer of conductive adhesive that is grounded to a flexible printed circuit on the backlight plate in accordance with an embodiment.

FIG. 5 is a cross-sectional side view of plate 98 and sensor flex 100 showing how an electromagnetic shield may be formed from a conductive adhesive layer between plate 98 and sensor flex 100. Sensor flex 100 may have ground traces 114 that form one or more ground contacts such as illustrative ground pad 114'. Traces 114 may be coupled to a source of ground potential within device 10. Electromagnetic shield 116 may be formed from a layer of conductive material interposed between sensor flex 100 and backlight plate 98. With one suitable arrangement, electromagnetic shield 116 may be formed from a layer of conductive adhesive (e.g., a polymer containing conductive particles such as metal particles). With another suitable arrangement, electromagnetic shield 116 may be formed from a layer of metal foil (e.g., copper foil, aluminum foil, or other metal foil).

Shield 116 (e.g., conductive adhesive, metal foil, or other conductive material) may be sandwiched between upper and lower layers of adhesive such as upper pressure sensitive adhesive layer 126 and lower pressure sensitive adhesive layer 118 (e.g., pressure sensitive adhesive layers or other adhesive layers that are not conducting). Aligned openings may be formed within layers 126, 116, 118, and 98 to form a cylindrical opening or other hole such as opening 122. Opening 122 penetrates from rear surface 128 of plate 98 to the lower surface of sensor flex 100, thereby exposing ground pad 114'. This allows conductive material 124 (e.g., a conductive material such as a curable liquid polymer containing metal particles) to be placed into opening 122. Conductive material 124 creates a short circuit path such as path 120 that shorts shield 116 to ground pad 144', thereby grounding shield 116.

If desired, the size and/or shape of the openings in the layers of FIG. 5 may be different. For example, the sizes and shapes of the openings formed through layers 98, 118, 116, and 126 to create the hole that exposes pad 114' need not be of identical shapes and sizes. For example, the openings in adhesive layers 118 and/or 126 may be larger than the opening in shield layer 116 to help create additional exposed surfaces on shield layer 116. These exposed surfaces may help form a satisfactory electrical connection between material 124 and shield 116.

Figure 6:
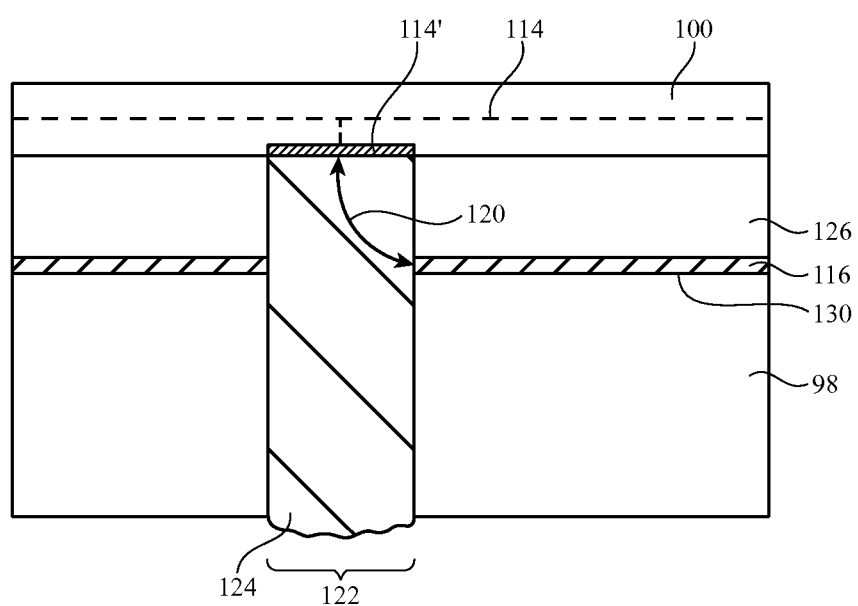
FIG. 6 is a cross-sectional side view of an illustrative backlight plate in which a shield layer is formed from a metal coating on the backlight plate that is grounded to a flexible printed circuit on the backlight plate in accordance with an embodiment.

As shown in the illustrative configuration of FIG. 6, shield 116 may be formed by depositing a metal coating on upper surface 130 of plate 98. The metal layer that is used in forming shield 116 may be deposited using physical vapor deposition (e.g., evaporation or sputtering), may be formed using electrochemical deposition (e.g., using electroplating or electroless deposition techniques), and/or by otherwise applying a conductive coating to upper surface 130 of plate 98. Opening 122 may be filled with conductive material 124 to short shield 116 to ground pad 114', as illustrated by conductive path 120.

Figure 7:
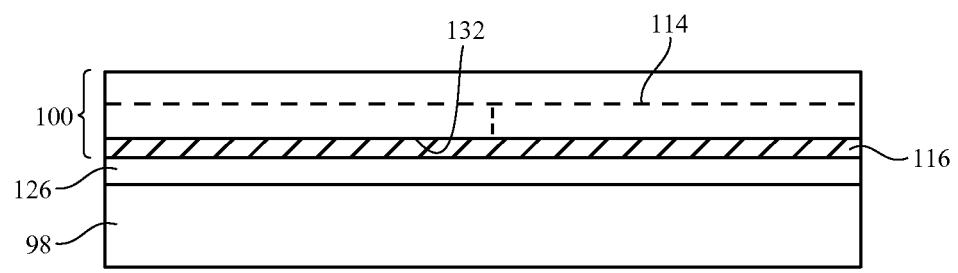
FIG. 7 is a cross-sectional side view of an illustrative backlight plate in which a shield layer is formed from a conductive layer on a flexible printed circuit mounted to the backlight plate in accordance with an embodiment.

Another illustrative arrangement for forming shield 116 between plate 98 and sensor flex 100 is shown in FIG. 7. In the configuration of FIG. 7, shield 116 has been formed from a metal coating layer on lower surface 132 of sensor flex 100. Shield 116 may be coupled to ground traces 114 in sensor flex 100, thereby grounding shield 116. Shield 116 may be formed from a planar region of metal traces (e.g., a blanket metal film) that is formed as part of the process of fabricating sensor flex 110. A layer of adhesive such as pressure sensitive adhesive 126 may be interposed between plate 98 and sensor flex 100 and may be used to attach sensor flex 100 to plate 98. With this type of approach, ground traces 114 may be coupled to shield 116 directly without need for additional conductive material such as conductive material 124.

Figure 8:
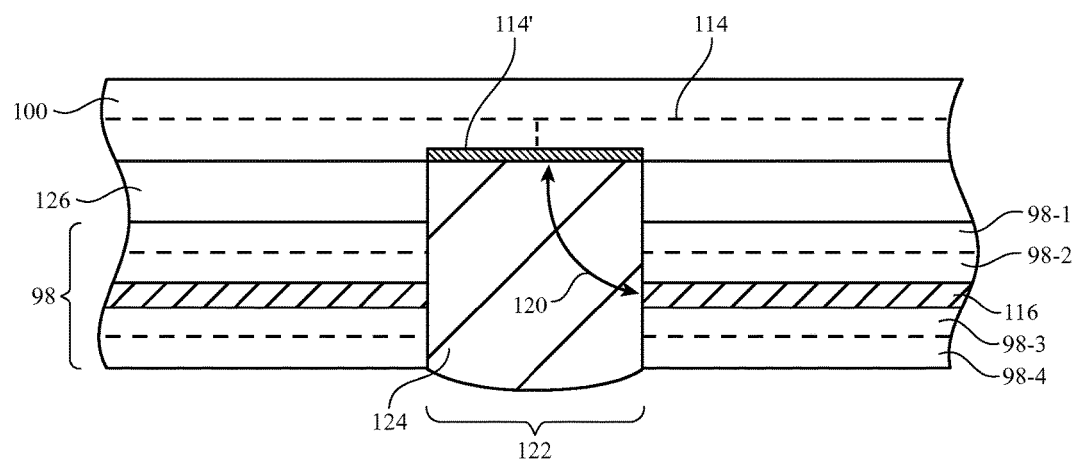
FIG. 8 is a cross-sectional side view of an illustrative backlight plate containing a layer of metal foil that serves as a shield for a sensor flexible printed circuit that has been mounted on the plate in accordance with an embodiment.

In the illustrative arrangement of FIG. 8, shield 116 has been formed from a metal layer such as a layer of metal foil (e.g., at thin sheet of metal having a thickness of 1-100 microns, 5-20 microns, 10-12 microns, 10-200 microns, less than 200 microns, less than 100 microns, more than 5 microns, or other suitable thickness). Shield 116 may be interposed between layers 98-1 and 98-2 of plate 98 and layers 98-3 and 98-4 of plate 98 or may be sandwiched between any other pair of layers in plate 98. The layers of plate 98 may be formed from carbon fiber prepreg that binds to shield 116 when cured under heat and pressure to form plate 98 and/or shield 116 may be coupled to the layers of plate 98 using layers of adhesive. Conductive material 124 in opening 122 may be used to electrically coupled shield 116 to ground pad 114', as indicated by conductive path 120.

Figure 9:
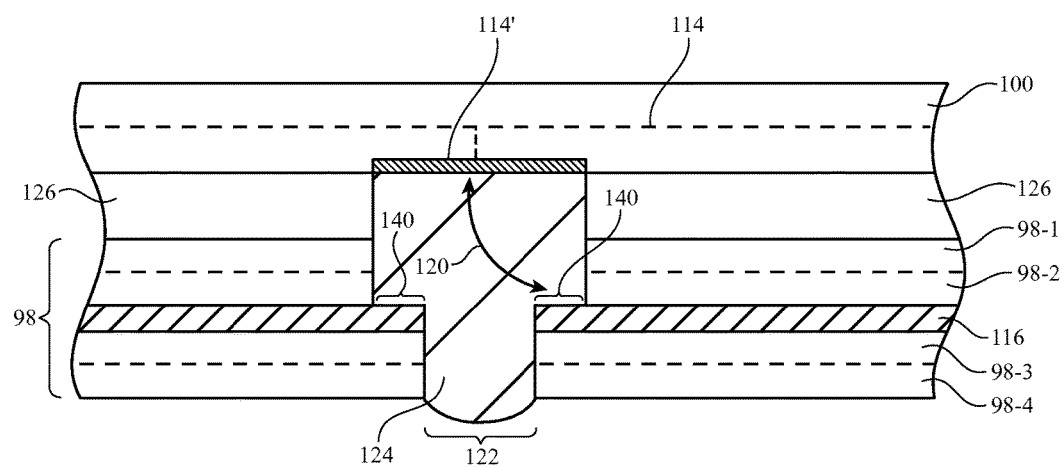
FIG. 9 is a cross-sectional side view of an illustrative backlight plate in which a conductive shield layer has a shelf region that assists in forming a low resistance grounding path between the conductive shielding layer and a ground in a sensor flexible printed circuit on the backlight plate in accordance with an embodiment.

As shown in the illustrative configuration of FIG. 9, the size of opening 122 may be enlarged as opening 122 passes through one or more of the layers adjacent to shield layer 116. Shield layer 116 of FIG. 9 may be, for example, a layer of metal foil or other metal layer that has been embedded between layers 98-2 and 98-3 of plate 98. Plate 98 may be attached to sensor flex 100 using pressure sensitive adhesive layer 126. In the example of FIG. 9, the opening in layers 98-1 and 98-2 of plate 98 is larger than the opening in layers 98-3 and 98-4. This exposes surface 140 of shield 116 (e.g., a circular ring-shaped surface that surrounds openings 122 or other exposed surface of shield 116) to conductive material 124 and helps form a low-resistance path (path 120) between shield 116 and ground pad 114'. Openings such as opening 122 of FIG. 9 may be formed using a milling tool (e.g., a mechanical machining tool), an etching tool, a laser drilling tool, or other suitable equipment for forming openings in plate 98 that expose metal surfaces such as surfaces 140.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a housing, wherein the housing comprises a rectangular housing having two opposing short edges and two opposing long edges that are longer than the short edges;
   a display mounted within the housing;
   backlight structures that supply backlight to the display, wherein the backlight structures include a fiber-composite plate and a light guide plate, wherein the fiber composite plate comprises:
   two outer unidirectional carbon-fiber layers; and
   two inner unidirectional carbon-fiber layers sandwiched between the two outer unidirectional carbon fiber layers, wherein the two outer unidirectional carbon-fiber layers have fibers running between the two opposing long edges parallel to the short edges, and wherein the two inner unidirectional carbon-fiber layers have fibers running between the two opposing short edges parallel to the long edges; and
   a flexible printed circuit that is supported on the fiber-composite plate and is interposed between the fiber-composite plate and the light guide plate.

2. The electronic device defined in claim 1 wherein the fiber-composite plate comprises at least first and second unidirectional fiber-composite layers having respective fibers that are perpendicular to each other.

3. The electronic device defined in claim 1 further comprising an electromagnetic shield layer that shields the flexible printed circuit.

4. The electronic device defined in claim 3 wherein the electromagnetic shield layer comprises a layer selected from the group consisting of: a layer of conductive adhesive and a layer of metal foil.

5. The electronic device defined in claim 4 further comprising a first layer of adhesive between the flexible printed circuit and the shield layer and a second layer of adhesive between the shield layer and the fiber-composite plate.

6. The electronic device defined in claim 3 wherein the fiber-composite plate has a surface and wherein the electromagnetic shield layer comprises a metal coating on the surface.

7. The electronic device defined in claim 6 further comprising a layer of adhesive between the electromagnetic shield layer and the flexible printed circuit.

8. The electronic device defined in claim 3 wherein the flexible printed circuit has a surface and wherein the electromagnetic shield layer comprises a metal layer on the surface.

9. The electronic device defined in claim 8 further comprising a layer of adhesive between the metal layer and the fiber-composite plate.

10. The electronic device defined in claim 3 wherein the electromagnetic shield layer comprises a layer of metal foil embedded within the fiber-composite plate.

11. The electronic device defined in claim 10 wherein the layer of metal foil has first and second opposing surfaces and wherein a portion of the first surface is exposed to conductive material that shorts the metal foil to a ground pad in the flexible printed circuit.

12. The electronic device defined in claim 3 wherein the flexible printed circuit has a ground trace, wherein the fiber-composite layer has an opening, and wherein the electronic device further comprises conductive material in the opening that shorts the electromagnetic shield layer to the ground trace.

13. The electronic device defined in claim 12 wherein the conductive material comprises a polymer with embedded metal particles.

14. The electronic device defined in claim 3 wherein the display has a surface that is deflected by application of pressure from a finger of a user and wherein the flexible printed circuit measures the deflection of the display.

15. An electronic device, comprising:
    a rectangular housing, wherein the rectangular housing has two opposing short edges and two opposing long edges;
    a display with backlight structures that include a light guide and a fiber-composite plate having at least some fibers that span the rectangular housing, wherein the fiber-composite plate comprises a pair of outer unidirectional carbon-fiber layers and a pair of inner unidirectional carbon-fiber layers sandwiched between the pair of outer unidirectional carbon-fiber layers, and wherein the outer unidirectional carbon-fiber layers have carbon fibers that run between the two opposing long edges;
    a flexible printed circuit supported on the fiber-composite plate; and
    an electromagnetic shield layer that is interposed between the fiber-composite plate and a portion of the flexible printed circuit that is interposed between the light guide and the fiber-composite plate.

16. The electronic device defined in claim 15 further comprising an opening in the fiber-composite plate and conductive material in the opening that shorts the electromagnetic shield layer to a ground pad on the flexible printed circuit.

* * * * *